United States Patent [19]

Arena et al.

[11] Patent Number: 5,232,508
[45] Date of Patent: Aug. 3, 1993

[54] GASEOUS PHASE CHEMICAL TREATMENT REACTOR

[75] Inventors: Chantal Arena, le Fontanil; Jean-Pierre Joly, St. Egreve; Patrice Noel, Sassenage; Michel Papapietro, Lyons, all of France

[73] Assignee: Commissariat a l'Energie Atomique, Paris, France

[21] Appl. No.: 953,471

[22] Filed: Sep. 29, 1992

[30] Foreign Application Priority Data

Oct. 7, 1991 [FR] France ............... 91 12316

[51] Int. Cl.$^5$ ............................ C23C 16/00
[52] U.S. Cl. .................... 118/719; 118/715; 118/725; 118/728; 118/729
[58] Field of Search ............ 118/715, 719, 725, 728, 118/729

[56] References Cited

U.S. PATENT DOCUMENTS

| | | | |
|---|---|---|---|
| 3,854,443 | 12/1974 | Baerg | 118/49 |
| 4,870,923 | 10/1989 | Sugimoto | 118/715 |
| 5,088,444 | 2/1992 | Ohmine | 118/719 |
| 5,091,217 | 2/1992 | Hey | 118/719 |
| 5,139,459 | 8/1992 | Takahashi | 118/719 |

Primary Examiner—Richard Bueker
Attorney, Agent, or Firm—Hayes, Soloway, Hennessey & Hage

[57] ABSTRACT

The invention relates to a gaseous phase chemical treatment reactor for wafers. The aim of the invention is to produce a reactor in which only the face of the wafer to be treated is in fact treated. This aim is achieved with the aid of a reactor comprising at least one treatment chamber (19) located within a main chamber (9) and connected by one of its ends to means (17) for injecting a treatment gas onto a wafer (1) and by its other end to a means (15) for securing said wafer, in that the latter is gripped between a heating susceptor or base (13) and the retaining means (15) in such a way as to seal said treatment chamber (19) and maintain within the latter a pressure below that of the main chamber (9). The invention more particularly relates to reactors for depositing tungsten on silicon wafers.

19 Claims, 2 Drawing Sheets

GASEOUS PHASE CHEMICAL TREATMENT REACTOR

DESCRIPTION

The present invention relates to a gaseous phase chemical treatment reactor more particularly making it possible to carry out chemical vapour deposition (CVD) on e.g. silicon wafers. The reactor also makes it possible to carry out chemical treatments for the etching of said wafers.

Thus, during the manufacture of integrated circuits on silicon wafers, onto the latter are deposited various materials using different physico-chemical processes and appropriate reactors. The reactor according to the invention makes it possible to deposit various materials on said wafers and more specifically tungsten, which is a material proving difficult to use.

Numerous US companies such as e.g. Applied Materials, Genus, Novellus and Varian manufacture and market reactors for tungsten CVD. However, most of these reactors suffer from a certain number of disadvantages. Chemical vapour deposition takes place at between 300° and 600° C., which makes it necessary to heat the silicon wafer to be treated. This heating operation can be carried out by several methods.

Firstly, the wafer can be directly heated by the radiation of appropriate lamps placed behind a radiation-transparent window. However, the latter must be protected from the metal deposits occurring in the chamber in order to maintain its transparency and this sometimes proves difficult. Moreover, when the heating takes place by lamps, the support of the wafer must have a very limited surface in order not to shade the same. Therefore the wafer is totally "immersed" in reactive gases, which leads to the desired deposits taking place on the face to be treated, i.e. the front face, but also on the edges and on its rear face, which should be prevented. Consequently, if a deposit remains where it should not occur, it is necessary to incorporate supplementary cleaning stages in order to remove it. These cleaning stages take a certain time and lead to a reduction in the production efficiency, which can be expensive. Moreover, such supplementary deposits lead to the waste of expensive chemical etching products, such as $NF_3$ used for etching tungsten (this is the case in the reactors manufactured by Applied Materials).

Secondly, the heating of the wafer can take place by thermal contact with a heating susceptor or base. Said susceptor must be heated, either by lamps (as in the case of the Applied Materials reactors), or by a heating resistor located in the mass of the susceptor in the case of reactors manufactured by Genus and Novellus).

The heating of the silicon wafer by means of a susceptor generally leads to poor heat exchanges between the wafer and the susceptor, if said wafer is simply placed on the susceptor. In order to improve these heat exchanges, certain reactors are equipped with means making it possible to form a vacuum between the wafer and the susceptor in order to improve the physical contact between said two component and therefore the heat conduction. However, these vacuum methods suffer from the disadvantage of attracting gases towards the rear face of the wafer and towards its edges or rims, so that deposits occur there, which should in fact be avoided. In the reactor manufactured by Novellus, it is proposed to form a vacuum on three quarters of the rear face of the wafer and to blow a gas onto its remaining quarter. However, this solution only provides a very limited protection to the edge of the wafer.

In the case of the reactor manufactured by Genus, the wafer is secured on its outer circumference by a retaining ring, which firmly engages the same onto the surface of the heating sole in order to improve the heat conduction. Although this method protects the rear face of the wafer, it has difficulties in protecting its peripheral edge.

In addition, designers proposing systems equipped with a heating susceptor have to deal with the need for cleaning the latter because, as a heat source, it is necessarily hotter than the wafer to be treated and when it is in contact with reactive gases, its surface is exposed to deposits. When the material deposits adhere to the susceptor, it is often a long and complicated process to clean the latter and involves the use of cleaning substances, which are sometimes not very compatible with the susceptor material or which could even attack its surface. Thus, in the case of the reactor manufactured by Varian, the silicon carbide sole may be attacked by fluorine-containing products used for cleaning the deposits which have accumulated on its surface.

If the deposits do not adhere to the susceptor, which is more particularly the case with tungsten deposits on most insulating materials, said deposits, on separating, generate metal particles which can be redeposited on the circuits to be produced on the wafer and consequently lead to faults.

Finally, the gases used for the treatments (CVD, etching) are generally very expensive, which is e.g. the case with tungsten hexafluoride and nitrogen trifluoride ($WF_6$ and $NF_3$). Consequently, it would be desirable to reduce to the minimum the volume of the treatment chamber, whilst increasing the efficiency of the reaction on the wafer. At present, the smallest volume of an existing chamber is 1 l for the treatment of a wafer.

The object of the invention is consequently to obviate these disadvantages, i.e. produce a reactor permitting vapour phase chemical treatments and in particular the deposition of material on the face to be treated (front face) of the wafer, whilst preventing deposits on its rear face and peripheral edge. Thus, these two parts are not generally covered beforehand with an adhesive coating for the deposition of materials, particularly tungsten, which gives rise to deposits which separate and produce particles, which tend to stick to the circuits and destroy the latter.

The invention consequently relates to a reactor for the chemical gaseous phase treatment of at least one wafer having a face to be treated and a face to be protected, said reactor comprising a main chamber maintained at a first pressure and within which are located the wafer, a susceptor for heating the wafer, means for securing the wafer and means for injecting the treatment gas on the face of the wafer to be treated.

According to the features of the invention, said reactor comprises at least one treatment chamber defined by its side walls, said treatment chamber being provided within the main chamber and being connected by one of its ends to the means for injecting the treatment gas and by its other end to the securing means, in that the wafer is gripped between the heating susceptor and the securing means in such a way that the latter rest on the periphery of the face to be treated, so that the wafer closes the treatment chamber and in that within the latter there is a second pressure lower than the pressure of the main chamber.

Thus, a treatment chamber is formed within the main chamber, said treatment chamber being sealed or closed at one of its ends by the wafer to be treated. Moreover, the pressure within the main chamber is higher than that in the treatment chamber, so that the treating gases cannot react and cannot be deposited in the main chamber in the case of a deposition-type treatment. These two characteristics make it possible to effectively limit the treatment to the front face of the wafer, whilst also protecting the heating susceptor in the main chamber from any treatments performed (deposition or etching). Advantageously, the heating susceptor is provided with motor means making it possible to move it axially relative to the securing means. Preferably said means are jacks. This makes it possible to effectively grip the wafer to be treated between the susceptor and said securing means, whilst also permitting the very rapid withdrawal of the wafer when the treatment is ended.

According to an advantageous feature of the invention, the means for securing the wafer to be treated on the heating sole are constituted by a flat ring. When in place the ring rests on the periphery of the face of the wafer to be treated in the form of a disk. However, wafers have generally undergone prior treatment stages during which marks have been left behind by grippers (or gripping rings) on the periphery of said wafers. Consequently, at these locations CVD may not adhere and may lead to the disadvantages referred to hereinbefore. The presence of the securing ring on the wafer periphery makes it possible to mask these marks and prevent depositions at these points. Moreover, the wafer securing means are installed on the side walls of the treatment chamber in a detachable manner.

Thus, the securing or retaining ring can be made from different materials and the material most suitable for the envisaged application and treatment gas will in fact be used. Thus, the retaining ring can be made from materials allowing a good electrical or thermal insulation (e.g. alumina) or a material catalyzing the chemical reaction performed in the reactor (e.g. a metal).

In addition, according to another advantageous feature of the invention, the means for injecting the treatment gas, provided at one of the ends of the treatment chamber, are installed on motor means permitting the movement thereof within the treatment chamber so as to vary its internal volume. Thus, and unlike in the prior art devices, it is possible to adapt the treatment chamber volume and in particular reduce the latter when the treatment gases used are expensive.

Moreover, advantageously, said motor means are cooled by a circuit in which circulates a cooling fluid. This is particularly interesting for high temperature treatment reactors.

According to a feature of the invention, the retaining ring can internally be provided with a heating resistor and/or the side walls of the treatment chamber can internally be provided with a cooling circuit. The latter makes it possible to obtain thermal variations within the treatment chamber and e.g. avoid the deposition of material on its side walls.

Finally, the main chamber can have at least two treatment chambers, said treatment chambers permitting the simultaneous treatment of at least two wafers.

The invention is described in greater detail hereinafter relative to a non-limitative embodiment and with reference to the attached drawings.

For reasons of clarity, the description referes to a deposition reactor. However, the reactor according to the invention can be used for other treatment types and in particular for etching.

Figure 1:
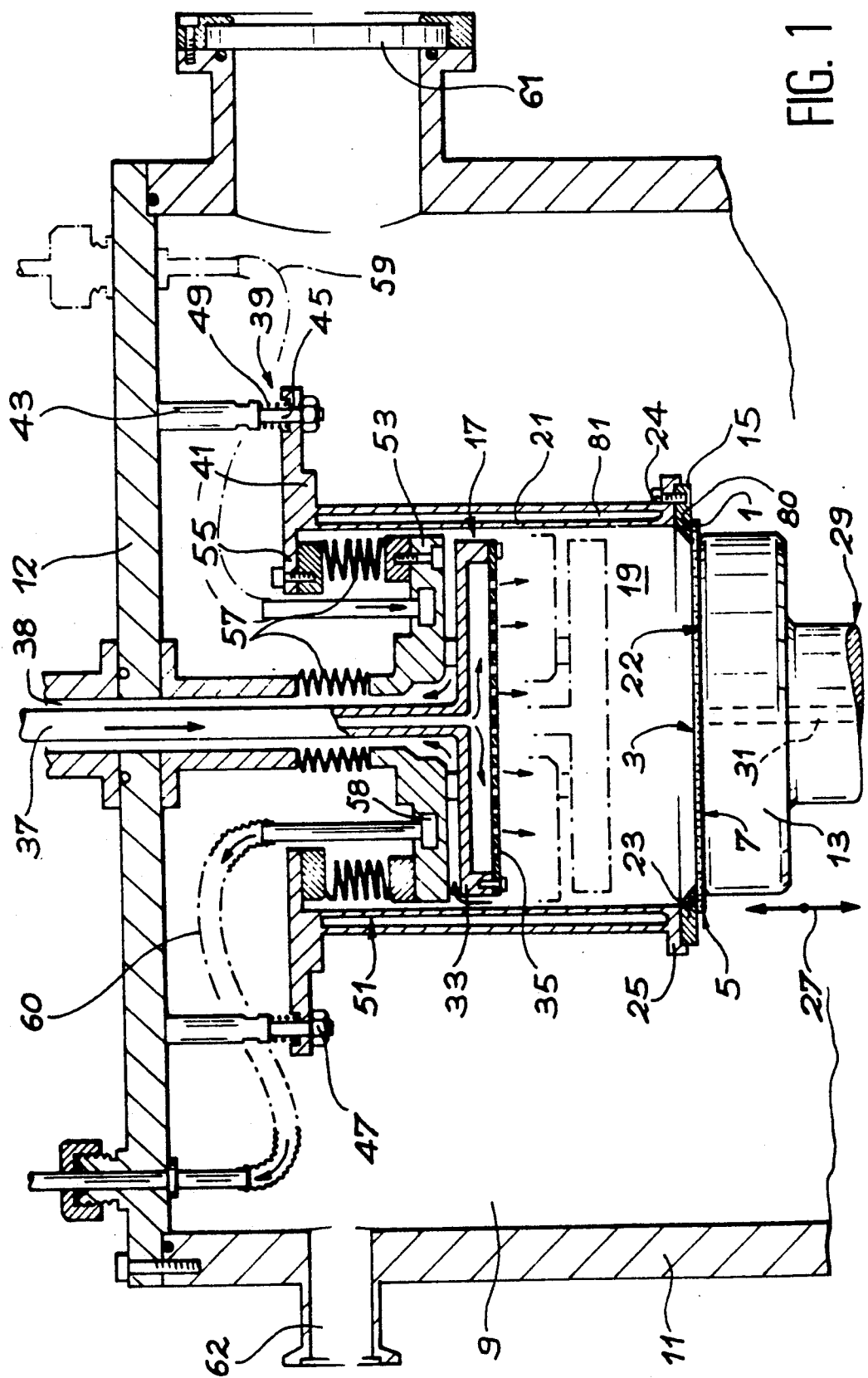
FIG. 1 A side view of the chemical treatment reactor according to the invention.
Figure 2:
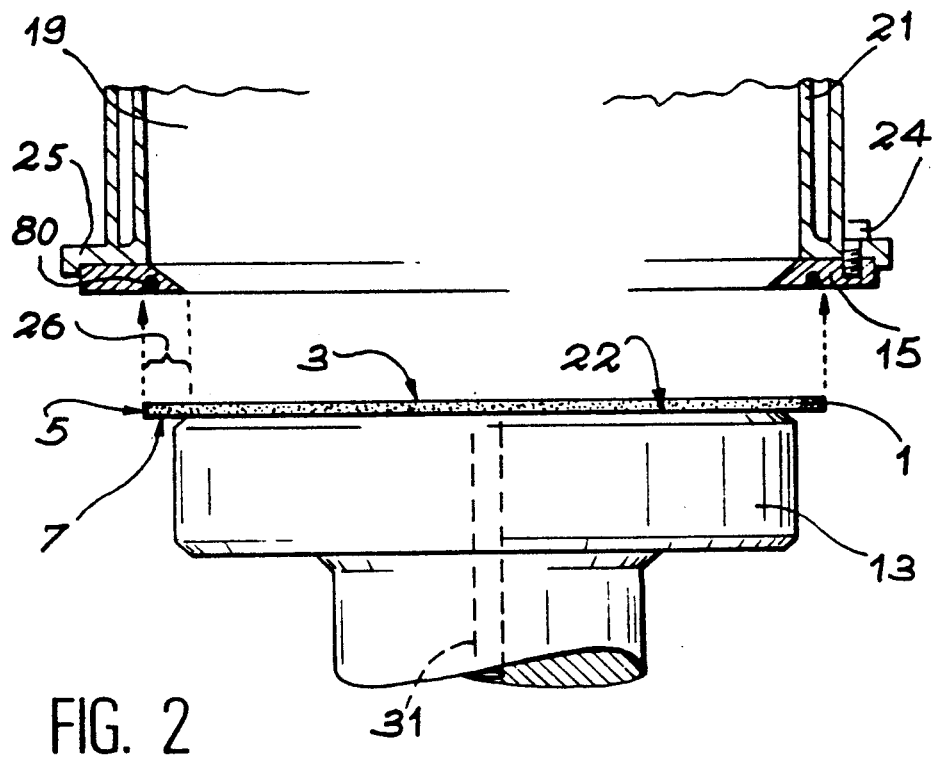
FIG. 2 A larger scale, part sectional view of part of said reactor.

As illustrated in FIGS. 1 and 2, the chemical treatment reactor according to the invention permits vapour phase deposits on a wafer 1 having a face 3 to be treated, a peripheral edge 5 and a face 7 to be protected from deposits and also referred to as the rear face. In a conventional manner, the reactor comprises a main chamber 9 defined by side walls 11 and an upper wall 12 and within which there is a first pressure $P_1$. The wafer 1 to be treated is placed within the main chamber 9 between a heating susceptor or base 13 and securing or retaining means 15. Within the chamber 9 there are also means 17 for injecting the treatment gas onto the surface 3 to be treated of the wafer 1.

According to the invention, the main chamber 9 is internally provided with at least one treatment chamber 19 defined by its side walls 21, said treatment chamber being connected by one of its ends to the means 17 permitting the injection of a gas and by its other end to the means 15 for securing the wafer.

As the wafer 1 to be treated is generally disk-shaped, it is consequently preferable for the heating susceptor 13 to have an upper circular surface 22, the side walls 21 of the treatment chamber 19 being cylindrical and the securing means 15 being formed by a flat ring having a bevelled inner edge 23. These circular or cylindrical shapes are in no way limitative. The ring 15 is detachably fixed to an annular, peripheral edge or rim 25 extending radially to the base of the treatment chamber walls 21 by means of several screws 24.

During use and as is shown in FIG. 1, the wafer 1 is gripped between the heating susceptor 13 and the securing ring 15. The latter rests on the annular periphery 26 (cf. FIG. 2) of the face 3 of the wafer to be treated. Therefore the wafer closes the treatment chamber 19 and it is consequently possible to have within the latter a pressure $P_2$ below the pressure $P_1$ prevailing in the main chamber 9.

Moreover, due to the fact that the retaining ring 15 rests on the outer periphery 26 of the face 3 to be treated and masks the latter, is of interest to the extent that said part is protected from any deposits, as was explained hereinbefore.

Finally, it is possible to provide within the ring 15 and in the side walls 21 a heat regulating system. It is therefore possible to compensate the heat losses due to contact between the ring and the wafer by e.g. providing a heating resistor 80 brazed in the ring 15 and/or it is possible to cool the side walls 21 in order to avoid there deposits by having in the thickness thereof an adequate cooling circuit 81. It is therefore possible to limit undesired deposits on the inner face of the walls 21 and therefore increase the use time of the reactor before it has to be cleaned.

In order to that the wafer to be treated can be fitted or removed easily with respect to the treatment chamber 19, said heating susceptor 13 is provided with motor means 27 permitting the axial displacement thereof in the direction of the retaining ring 15 or in the opposite direction. Preferably, said motor means are constituted by jacks (diagrammatically shown in FIG. 1).

According to a variant, it is possible to provide within the heating susceptor 13 means 29 for injecting a gas with a good thermal conductivity between the upper face 22 of the susceptor 13 and the rear face 7 of the wafer 1 to be treated. These means 29 comprise a duct 31 traversing the heating susceptor. The gas is injected at an adequate pressure $P_3$ for optimizing the heat exchanges between said susceptor 13 and the wafer 1. This gas injection is possible as soon as the wafer is in contact with the ring 15.

The combination of the pressures $P_2$ and $P_3$ respectively within the treatment chamber 19 and below the wafer 1 is particularly suitable in cases of high pressure deposits. Thus, the difference between the pressures $P_2$ and $P_3$ ($P_2 > P_3$) combines with the mechanical pressure effect of the retaining means 15 in order to keep the wafer 1 in close contact with the heating susceptor 13. This improves the efficiency of the heat exchanges between the susceptor and the wafer and prevents convex deformations of the wafer disengaging it from the susceptor.

The means 17 for injecting the treatment gas comprise a gas injector 33 equipped with perforations 35 and supplied by a duct 37 through which is supplied the treatment gas maintained at the pressure $P_2$. This gas is discharged from the treatment chamber 19 by a duct 38 coaxial to the duct 37 and issuing in the upper part of the main chamber.

The upper part of the side walls 21 defining the treatment chamber 19 is connected to the upper wall 12 of the main chamber 9 by damping means 39 making it possible to compensate seating differences between the heating susceptor 13 and the securing ring 15.

More specifically, the upper part of the side walls 21 of the treatment chamber is provided with an annular rim 41 extending radially towards the outside substantially parallel to the main chamber wall 12. A plurality of spindles 43 (only two are shown in FIG. 1) extend within the chamber 9 from the wall 12. Each spindle 43 has at its end a smaller diameter rod 45 traversing the rim 41. The rod end is threaded so as to receive a bolt 47 permitting the fixing of the rim 41 and therefore the suspension of all the treatment chamber 19 and gas injection means 17 on the upper wall 12 of the reactor.

In order to carry out the damping (means 39), a helical spring 49 is placed around the rod 45 and is secured at its two ends respectively by the spindle 43 and by the rim 41.

According to a constructional variant, the means 17 for injecting a treatment gas onto the wafer 1 can be fitted on displacement means 51 permitting the axial displacement of the injector 33 within the treatment chamber 19. More specifically, the injector 33 is mounted on a support plate 53, whilst the upper part of the side walls 21 have an annular extension 55 extending radially towards the inside and positioned facing the rim 41. A plurality of bellows or springs 57 are fixed between the extension 55 and the support plate 53. Under the action of pistons or jacks (not shown in FIG. 1), the injector 33 can move axially within the treatment chamber 19 between an upper position (shown in continuous line form in FIG. 1) and a lower position (shown in mixed line form). It is therefore possible to vary the treatment chamber volume and e.g. reach a volume of 0.5 l, which is relatively small compared with the prior art.

Advantageously, the support plate 53 is internally provided with a cooling circuit 58 connected to a cooling fluid supply duct 59 and a discharge duct 60. It should be noted that the supply and discharge ducts are flexible so as to be able to follow the axial displacement movement. Finally, the reactor comprises means for injecting a pressurized gas $P_1$ into the main chamber 9 (entering by duct 62) and not shown means for pumping the said gas. The reactor can also have an inspection window 61.

A practical example of the invention will now be described.

EXAMPLE 1

A chemical treatment reactor based on the principle of the present invention consists of having at least one sealed treatment chamber within a main chamber has already been constructed. This reactor made it possible to make a tungsten deposit under the following conditions:

pressure $P_1$ within the main chamber 9: 100 Torrs ($1.33.10^4$ Pa),
gas injected into the main chamber: hydrogen,
pressure $P_2$ within the treatment chamber 19: 80 Torrs ($1.06.10^4$ Pa),
gas injected: mixture of hydrogen and tungsten hexafluoride,
pressure $P_3$ of gas injected by means 29: 10 Torrs ($1.3.10^3$ Pa),
injected gas: hydrogen.

The main aim of the invention was achieved, because it was possible to deposit the tungsten solely on the exposed surface 3 of the wafer 1, whilst totally avoiding parasitic deposits on the edges 5 and lower surface 7.

Figure 3:
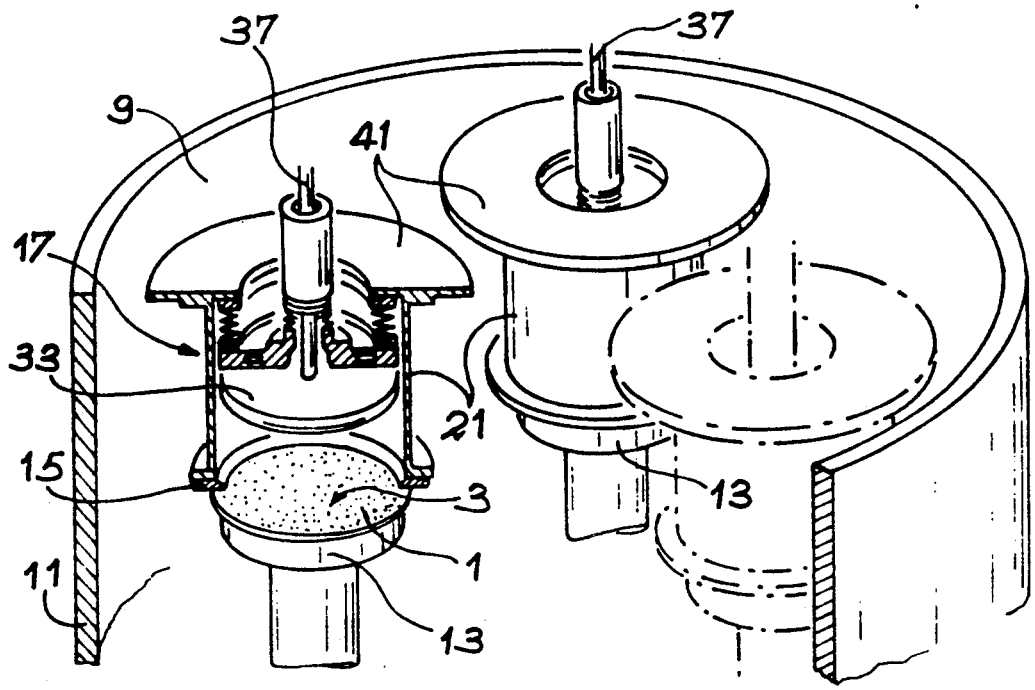
FIG. 3 A diagrammatic perspective view illustrating a second embodiment of the invention.

Finally, it was possible according to a second constructional variant to provide within a single main chamber 9, a plurality of treatment chambers 19 and the same number of heating susceptors 13, securing means and gas injecting means, so that it was possible to treat the same number of wafers 1. FIG. 3 is a diagram illustrating this second variant.

We claim:

1. Reactor for the gaseous phase chemical treatment of at least one wafer (1) having a face (3) to be treated and a face (7) to be protected, said reactor comprising a main chamber (9) maintained at a first pressure ($P_1$) and within which are located the said wafer (1), a susceptor (13) for heating said wafer, means (15) for securing the wafer and means (17) for injecting the treatment gas onto the face (3) of the wafer to be treated, characterized in that it comprises at least one treatment chamber (19) defined by its side walls (21), said treatment chamber (19) being provided within the main chamber (9) and being connected by one of its ends to the means (17) for injecting the treatment gas and by its other end to the securing means (15), in that the wafer (1) is gripped between the heating susceptor (13) and the securing means (15) in such a way that the latter rests on the periphery of the face (3) to be treated, so that the wafer (1) closes said treatment chamber (19) and in that within the said treatment chamber there is a second pressure ($P_2$) lower than the pressure ($P_1$) of the main chamber (9).

2. Chemical treatment reactor according to claim 1, characterized in that the heating susceptor (13) is provided with motor means (27) permitting the axial displacement thereof relative to the securing means (15).

3. Chemical treatment reactor according to claim 2, characterized in that the motor means (27) comprise jacks.

4. Chemical treatment reactor according to claim 1, characterized in that the securing means (15) are constituted by a flat ring.

5. Chemical treatment reactor according to claim 1 characterized in that the securing means (15) are detachably fitted to the side walls (21).

6. Chemical treatment reactor according to claim 1, characterized in that the means (17) for injecting a treatment gas comprise an injector (33) having perforations (35), said injector (33) being supplied by a treatment gas supply duct (37) maintained under the second pressure ($P_2$).

7. Chemical treatment reactor according to claim 1 characterized in that the treatment gas injection means (17) are installed on displacement means (51) permitting the axial displacement of the injection means (17) within the treatment chamber (19) and also permitting the variation of the internal volume of the latter.

8. Chemical treatment reactor according to claim 7, characterized in that the displacement means (51) comprise bellows (57) associated with jacks.

9. Chemical treatment reactor according to claim 1 characterized in that the heating susceptor (13) is equipped with means (29) for injecting a gas maintained under a third pressure ($P_3$), between the upper surface (22) of the susceptor (13) and the face (7) to be protected of the wafer (1), so as to aid heat exchanges between said susceptor and said wafer.

10. Chemical treatment reactor according to claim 4, characterized in that the retaining ring (15) is internally provided with a heating resistor (80).

11. Chemical treatment reactor according to claim 1 characterized in that the side walls (21) of the treatment chamber (19) are internally provided with a cooling circuit (81).

12. Chemical treatment reactor according to claim 1 characterized in that the treatment chamber (19) linked with the securing means (15) is connected to the upper wall (12) of the main chamber (9) by damping means (39).

13. Chemical treatment reactor according to claim 12, characterized in that said damping means (39) comprise springs (49).

14. Chemical treatment reactor according to claim 1 characterized in that the main chamber (9) is provided with means for injecting and pumping a gas making it possible to maintain the first pressure ($P_1$).

15. Chemical treatment reactor according to claim 7, characterized in that the displacement means (51) comprise a support plate (53) on which are installed the injection means (17), said support plate (53) being internally provided with a cooling circuit (58) connected to the supply duct (59) for the cooling fluid and to a discharge duct (60).

16. Chemical treatment reactor according to claim 4 characterized in that the securing means (15) are detachably fitted to the side walls (21).

17. Chemical treatment reactor according to claim 6 characterized in that the treatment gas injection means (17) are installed on displacement means (51) permitting the axial displacement of the injection means (17) within the treatment chamber (19) and also permitting the variation of the internal volume of the latter.

18. Chemical treatment reactor according to claim 17, characterized in that the displacement means (51) comprise bellows (57) associated with jacks.

19. Chemical treatment reactor according to claim 6, characterized in that the displacement means (51) comprise a support plate (53) on which are installed the injection means (17), said support plate (53) being internally provided with a cooling circuit (58) connected to the supply duct (59) for the cooling fluid and to a discharge duct (60).

* * * * *